United States Patent
Salman et al.

(10) Patent No.: US 7,376,499 B2
(45) Date of Patent: May 20, 2008

(54) STATE-OF-HEALTH MONITORING AND FAULT DIAGNOSIS WITH ADAPTIVE THRESHOLDS FOR INTEGRATED VEHICLE STABILITY SYSTEM

(75) Inventors: Mutasim A. Salman, Rochester Hills, MI (US); Mark N. Howell, Rochester Hills, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 256 days.

(21) Appl. No.: 11/228,913

(22) Filed: Sep. 16, 2005

(65) Prior Publication Data

US 2007/0067078 A1  Mar. 22, 2007

(51) Int. Cl.
*G01M 17/00* (2006.01)
(52) U.S. Cl. .............................. 701/34; 701/29; 701/33; 340/425.5; 340/438; 700/258; 702/104; 702/108; 702/116
(58) Field of Classification Search .................. 701/29, 701/33, 34; 340/425.5, 438; 700/258; 702/104, 702/108, 116
See application file for complete search history.

(56) References Cited

U.S. PATENT DOCUMENTS

| | | | | |
|---|---|---|---|---|
| 5,707,117 A | * | 1/1998 | Hu et al. | 303/122.08 |
| 6,122,568 A | * | 9/2000 | Madau et al. | 701/1 |
| 6,122,577 A | * | 9/2000 | Mergenthaler et al. | 701/34 |
| 6,253,130 B1 | * | 6/2001 | Mergenthaler et al. | 701/34 |
| 6,427,102 B1 | * | 7/2002 | Ding | 701/34 |
| 6,623,089 B2 | * | 9/2003 | Amberkar | 303/146 |
| 6,625,527 B1 | * | 9/2003 | Ding et al. | 701/34 |
| 6,925,796 B2 | * | 8/2005 | Nieuwstadt et al. | 60/277 |
| 7,113,861 B2 | * | 9/2006 | Jacobson | 701/101 |
| 7,133,755 B2 | * | 11/2006 | Salman et al. | 701/29 |
| 7,136,729 B2 | * | 11/2006 | Salman et al. | 701/29 |
| 7,228,249 B2 | * | 6/2007 | Hartrey | 702/116 |

OTHER PUBLICATIONS

U.S. Appl. No. 10/899,445, filed Jul. 26, 2004, Salman et al.
U.S. Appl. No. 10/899,210, filed Jul. 26, 2004, Salman et al.

* cited by examiner

*Primary Examiner*—Thomas Black
*Assistant Examiner*—Wae Lenny Louie

(57) ABSTRACT

A system and related method for monitoring the state of health of sensors in an integrated vehicle stability control system. In one embodiment, the system determines whether a yaw rate sensor, a lateral acceleration sensor or a hand-wheel angle sensor has failed. The system uses a plurality of models to generate estimates of the outputs of the sensors based on the actual sensor measurements. Residuals are generated as the difference between the measured value and each of the estimates for the particular sensor. The residuals are compared to a threshold to determine whether a fault flag will be set for each residual. The threshold for the hand-wheel angle sensor is an adaptive threshold because it does not have physical redundancy. If the fault flags for the residuals for each sensor have a particular pattern, then a fault is output for that sensor.

19 Claims, 1 Drawing Sheet

STATE-OF-HEALTH MONITORING AND FAULT DIAGNOSIS WITH ADAPTIVE THRESHOLDS FOR INTEGRATED VEHICLE STABILITY SYSTEM

BACKGROUND OF THE INVENTION

1. Field of the Invention

This invention relates generally to a method for monitoring the state of health and providing fault diagnosis for sensors in an integrated vehicle stability system and, more particularly, to a method for monitoring the state of health and providing fault diagnosis for sensors in an integrated vehicle stability system, where the method employs adaptive thresholds when comparing model based sensor output estimates and sensor measurements.

2. Discussion of the Related Art

Diagnostics monitoring for vehicle stability systems is an important vehicle design consideration to be able to quickly detect system faults, and isolate the faults for maintenance purposes. These stability systems typically employ various sensors, including yaw rate sensors, lateral acceleration sensors and steering hand-wheel angle sensors, that are used to help provide the stability control of the vehicle. For example, certain vehicle stability systems employ differential braking in response to an undesired turning or yaw of the vehicle. Other vehicle stability systems employ active front-wheel or rear-wheel steering that assist the vehicle operator in steering the vehicle in response to the detected rotation of the steering wheel. Other vehicle stability systems employ active suspension stability systems that change the vehicle suspension in response to road conditions and other vehicle operating conditions.

If any of the sensors, actuators and sub-systems associated with these stability systems fail, it is desirable to quickly detect the fault and activate fail-safe strategies so as to prevent the system from improperly responding to a perceived, but false condition. It is also desirable to isolate the defective sensor, actuator or sub-system for maintenance and replacement purposes, and also select the proper fail-safe action for the problem. Thus, it is necessary to monitor the various sensors, actuators and sub-systems employed in these stability systems to identify a failure.

SUMMARY OF THE INVENTION

In accordance with the teachings of the present invention, a system and related method for monitoring the state of health of sensors in an integrated vehicle stability control system is disclosed. In one embodiment, the system determines whether a yaw rate sensor, a lateral acceleration sensor or a hand-wheel angle sensor has failed. The system uses a plurality of models to generate estimates of the outputs of the sensors based on the actual sensor measurements. Residuals are generated as the difference between the measured sensor value and each of the estimates for the particular sensor. The residuals are compared to a threshold to determine whether a fault flag will be set for each residual indicating a potential sensor fault. The threshold for the hand-wheel angle sensor uses an adaptive threshold because a redundant hand-wheel angle sensor is not provided. If the fault flags for the residuals for each sensor have a particular pattern, then a fault is output for that sensor indicating a failure.

Additional features of the present invention will become apparent from the following description and appended claims taken in conjunction with the accompanying drawings.

DETAILED DESCRIPTION OF THE EMBODIMENTS

Figure 1:
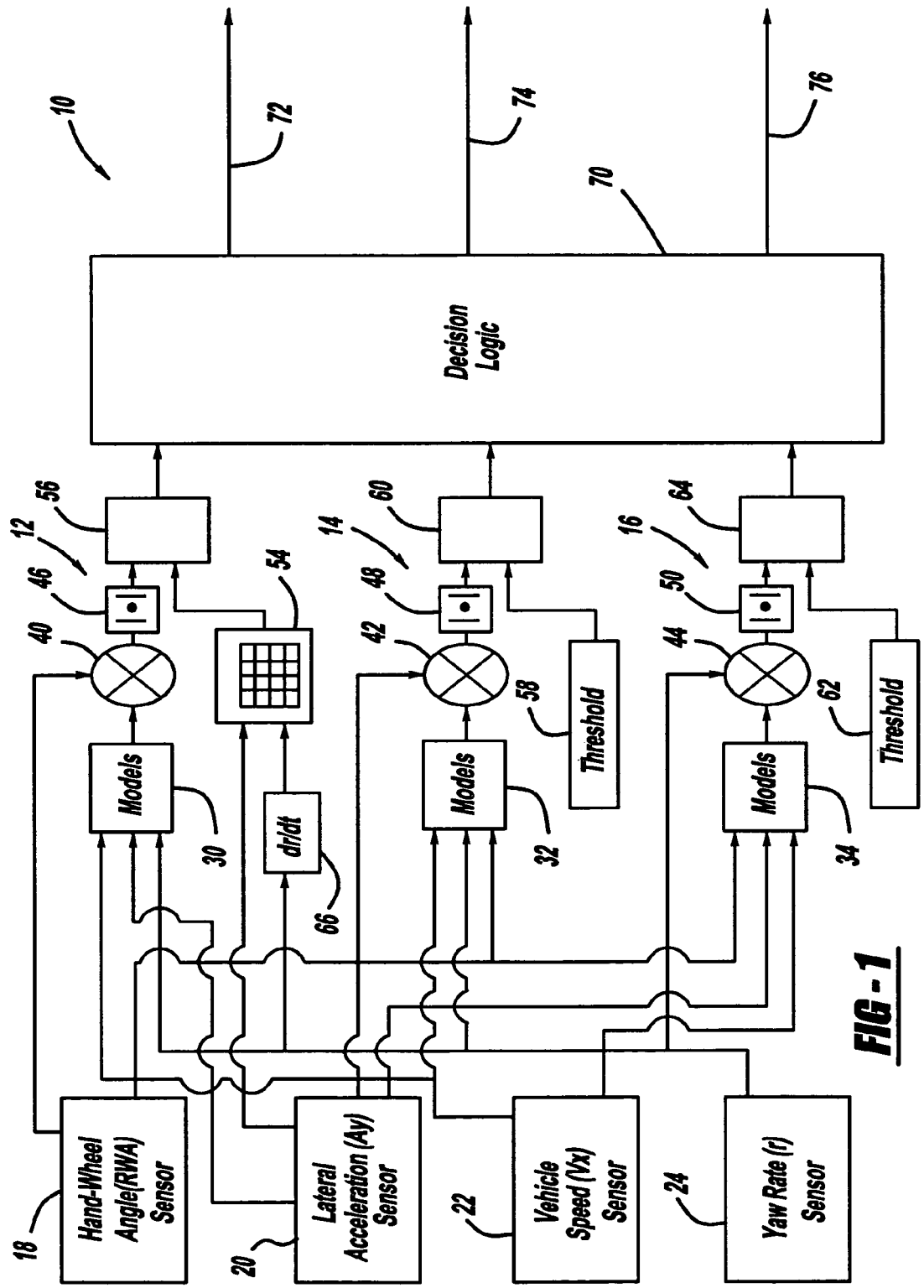
FIG. 1 is a block diagram of a state of health monitoring system that employs an adaptive threshold, according to an embodiment of the present invention.

The following discussion of the embodiments of the invention directed to a system and method for monitoring the state of health of sensors, actuators and sub-systems in an integrated vehicle stability control system is merely exemplary in nature, and is in no way intended to limit the invention or its applications or uses.

The present invention employs an algorithm for monitoring the state of health of sensors that are used in an integrated vehicle stability control system. The integrated vehicle stability control system may employ yaw rate sensors, vehicle lateral acceleration sensors, a vehicle speed sensor and a road wheel angle sensor at the vehicle level. The integrated control system may further include active brake control sub-systems, active front and rear steering assist sub-systems and semi-active suspension sub-systems. Each component and system used in the integrated vehicle stability control system employs its own diagnostics monitoring, where the diagnostics signals are sent to a supervisory monitoring system. The supervisory system collects all the information from the sub-systems, components and sensors, and uses information fusion to detect, isolate and determine the faults in the stability control system.

According to the present invention, physical sensor redundancy, i.e., a primary sensor and a secondary sensor, is used to detect faults in the yaw rate sensors and lateral acceleration sensors. Analytical redundancy with fixed thresholds, and fusion of multi-model based estimators with sensor measurements are used for back-up fault detection and isolation of the faults. Because there is only one hand-wheel angle sensor, analytical redundancy with adaptive thresholds, multi-model estimators and fusion of multi-model estimators with sensor measurements are used for fault detection isolation for this sensor. Thresholds that adapt to vehicle operating conditions increase the algorithm sensitivity to fault detection and its robustness to false alarms.

U.S. patent application Ser. No. 10/899,210, filed Jul. 26, 2004, titled Supervisory Diagnostics for Integrated Vehicle Stability System, assigned to the Assignee of this application and herein incorporated by reference, discloses a system and method for determining the difference between the output of a primary sensor and a secondary sensor, and comparing the difference to a predetermined threshold to determine whether one of the sensors has failed. U.S. patent application Ser. No. 10/899,444, filed Jul. 26, 2004, titled State of Health Monitoring and Fault Diagnosis for Integrated Vehicle Stability System, assigned to the Assignee of this application and herein incorporated by reference, discloses a monitoring system, similar to the monitoring system discussed below, where model equations are used to provide estimations of vehicle road wheel angle, vehicle yaw rate and vehicle lateral acceleration, where the estimates for the model equations are compared to actual measurements from the sensors to define residuals or errors. The pattern of residuals is then used to determine whether the particular sensor has failed.

FIG. 1 is a block diagram of a state of health monitoring and fault diagnosis system 10, according to an embodiment of the present invention. The system 10 includes a sub-system 12 for determining whether a hand-wheel angle sensor 18 has failed, a sub-system 14 for determining whether a primary lateral acceleration sensor 20 has failed and a sub-system 16 for determining whether a primary yaw rate sensor 24 has failed. The hand-wheel angle sensor 18 provides a road wheel angle (RWA) signal for the vehicle, the lateral acceleration sensor 20 provides a lateral acceleration signal (Ay) of the lateral acceleration of the vehicle, and the yaw rate sensor 24 provides a yaw rate signal (r) of the yaw rate of the vehicle. A vehicle speed sensor 22 provides a vehicle speed signal (Vx) of the speed of the vehicle.

The sub-systems 12, 14 and 16 include a model processor 30, 32 and 34, respectively, that provide models for the outputs of the particular sensor. The model processor 30 receives the vehicle speed signal Vx, the vehicle lateral acceleration signal Ay and the vehicle yaw rate signal r from the applicable sensors. The model processor 32 receives the vehicle speed signal Vx, the vehicle yaw rate signal r and the road wheel angle signal RWA from the applicable sensors. The model processor 24 receives the road wheel angle signal RWA, the vehicle speed signal Vx and the vehicle lateral acceleration signal Ay from the applicable sensors.

The processor 30 provides three estimates of the road wheel angle based on three separate model equations, the processor 32 provides three estimates of the lateral acceleration of the vehicle based on three separate model equations and the processor 34 provides three estimates of the yaw rate of the vehicle based on three separate model equations. Table 1 below shows the model equations used in the processors 30, 32 and 34 for each of the yaw rate estimates, the lateral acceleration estimates and the road wheel angle estimates. Thus, nine estimates are generated. In the model equations, L is the vehicle wheel base and K is the vehicle understeer coefficient. To reduce numerical computation and threshold calibration, only signals from the primary lateral acceleration and yaw rate sensors are used as the actual measurement in the nine model equations.

The sub-system 12 includes a residual generator 40, the sub-system 14 includes a residual generator 42 and the sub-system 16 includes a residual generator 44. The residual generator 40 receives the measured road wheel angle signal from the hand-wheel angle sensor 18 and the road wheel angle model estimates from the processor 30, and generates three residuals R31, R32 and R33 as the difference between the measured road wheel angle signal and the estimates, as shown in Table 2 below. The residual generator 42 receives the measured lateral acceleration signal Ay from the primary lateral acceleration sensor 20 and the lateral acceleration model estimates from the processor 32, and generates three residuals R21, R22 and R23 as the difference between the measured lateral acceleration signal Ay and the estimates, also shown in Table 2. The residual generator 44 receives the measured yaw rate signal r from the primary yaw rate sensor 24 and the yaw rate model estimates from the model processor 34, and generates three residuals R11, R12 and R13 as the difference between the measured yaw rate signal r and the estimates, also shown in Table 2. The residuals are applied to an absolute value generator 46 in the sub-system 12, an absolute value generator 48 in the sub-system 14 and an absolute value generator 50 in the sub-system 16 to provide the absolute value of the residuals.

TABLE 2

|  | Yaw Rate (YR) Residuals | Lateral Acceleration (Ay) Residuals | Road Wheel Angle (RWA) Residuals |
| --- | --- | --- | --- |
| Model 1 | $R11 = |YR_m - YR_{est1}|$ | $R21 = |Ay_m - Ay_{est1}|$ | $R31 = |RWA_m - RWA_{est1}|$ |
| Model 2 | $R12 = |YR_m - YR_{est2}|$ | $R22 = |Ay_m - Ay_{est2}|$ | $R32 = |RWA_m - RWA_{est2}|$ |
| Model 3 | $R13 = |YR_m - YR_{est3}|$ | $R23 = |Ay_m - Ay_{est3}|$ | $R33 = |RWA_m - RWA_{est3}|$ |

The error or residual between the model estimate values and the actual measurement values can be the result of several factors. These factors include modeling errors due to parameter variations, i.e., the under-steer coefficient, vehicle model non-linearities, transient effects, sensor biases and measurement noise, outside disturbances, such as bank angle effect and faults.

The absolute values of the residuals are compared to predetermined thresholds. If the absolute value of the residual is greater than or equal to the threshold, then a potential fault is detected and a fault flag (binary one) is activated. If not, then no fault flag is set and the output will be a binary zero. For example, if the value of R11 is greater than the predetermined threshold, then R11_flag=1 is set.

Particularly, in the sub-system 12, the absolute value of the residual from the absolute value generator 46 and an adaptive threshold from an adaptive threshold generator 54 are applied to a comparator 56 that compares the two values, and sets a fault flag to 1 if the absolute value of the residual is greater than or equal to the threshold. In the sub-system 14, a predetermined threshold from a threshold generator 58 and the absolute value of the residual from the generator 48

TABLE 1

|  | Yaw Rate (YR) | Lateral Acceleration (Ay) | Road Wheel Angle (RWA) |
| --- | --- | --- | --- |
| Model 1 | $YR_{est} = Ay/V_x$ | $Ay_{est} = YR * V_x$ | $RWA_{est} = (L/V_x^2 + K) * Ay$ |
| Model 2 | $YR_{est} = RWA * V_x/(L + KV_x^2)$ | $Ay_{est} = RWA * V_x^2/(L + Ku^2)$ | $RWA_{est} = YR * ((L + KV_x^2)/V_x)$ |
| Model 3 | $YR_{est} = U/L * (RWA - K * Ay)$ | $Ay_{est} = (RWA - L/V_x * YR)/K$ | $RWA_{est} = YR * L/V_x + KAy$ | are applied to a comparator 60 that compares the two values, and sets a fault flag to 1 if the residual is greater than or equal to the threshold. In the sub-system 16, a predetermined threshold from a threshold generator 62 and the absolute value of the residual from the generator 50 are applied to a comparator 64 that compares the two values, and sets a fault flag 1 if the residual is greater than or equal to the threshold.

One point of sensor failure is the failure of the attachment of the hand-wheel angle sensor 18 to the steering column. This may lead to a measurement value that is stuck at a constant level. Therefore, it is important to have an early detection of this fault so as to have a timely control reaction. It is also important not to have any false alarms. To optimize the tradeoff between early detection and false alarms, the adaptive threshold from the generator 54 is used for determining if the hand-wheel angle sensor 18 has failed, according to the invention. Information about the vehicle operating conditions is used to minimize the adaptive threshold value.

Because there is only one hand-wheel angle sensor, the adaptive threshold for the road wheel angle residual in the sub-system 12 is based on the measured lateral acceleration signal Ay from the sensor 20 and the change of the measured yaw rate signal r with respect to time (yaw acceleration) from a yaw rate derivative processor 66. The regions of operation of the vehicle are divided into the following categories. For linear and steady state operations, the linear and steady state models are fairly accurate and consequently small adaptive threshold values are used. For linear and unsteady operation (high yaw acceleration), the linear and steady state models are less accurate and higher thresholds are used. For non-linear and steady state operation, the linear and steady state models are less accurate and higher thresholds are needed. For non-linear and unsteady vehicle operation, the linear and steady state models are far less accurate and higher thresholds are needed. The results from vehicle tests are collected in a three dimensional plot. The lateral acceleration and yaw acceleration are on the x-y plane and the maximum residual values are on the z-axis. The x-y plane is divided into appropriate regions and the maximum residual value is found as the threshold in the selected region.

An example of adaptive thresholds determined in this manner are shown in Table 3. Particularly, for the residual R13, the adaptive threshold is set at the value shown in the third column based on the relationship between the yaw acceleration being above or below 0.5 radians/sec$^2$ and the lateral acceleration being greater than or less than 1.2 m/sec2 as shown in the first and second columns. Similar tables can be provided for the residuals R11 and R12. The adaptive threshold can be selected after vehicle testing.

TABLE 3

| Yaw Acceleration Rad/sec$^2$ | Lateral Acceleration m/sec$^2$ | R13_threshold rad/sec |
|---|---|---|
| <0.5 | <1.2 | 0.073 |
| >0.5 | <1.2 | 0.122 |
| <0.5 | >1.2 | 0.148 |
| >0.5 | >1.2 | 0.177 |

In the sub-systems 14 and 16, the threshold values are chosen in such a way so as to incorporate the effect of modeling errors, transients, biases and outside disturbances. Filtering of the signal and counters are used to overcome the effect of signal noise.

All of the nine fault flag outputs from the sub-systems 12, 14 and 16 are sent to a decision logic process block 70 as a binary 1 or a binary 0. The decision logic processor 70 determines whether the hand-wheel angle sensor 18 has failed, whether the primary lateral acceleration sensor 20 has failed, and whether the primary yaw rate sensor 24 has failed based on a pattern of the residuals R11, R12, R13, R21, R22, R23, R31, R32 and R33. The decision logic processor 70 outputs a signal on line 72 if the hand-wheel angle sensor 18 has failed, outputs a signal on line 74 if the primary lateral acceleration sensor 20 has failed and outputs a signal on the line 76 if the primary yaw rate sensor 24 has failed, which can then be used by the supervisory processing algorithm to set a warning light or take other suitable fail safe operations.

Based on the equations from Tables 1 and 2, the processor 70 will determine that there is a fault in the primary yaw rate sensor 24 if the processor 70 receives the pattern of binary ones and zeros shown in Table 4 from the sub-system 16. The residual R23 is not used because of its numerical sensitivities.

TABLE 4

| | |
|---|---|
| R11_flag | 1 |
| R12_flag | 1 |
| R13_flag | 1 |
| R21_flag | 1 |
| R22_flag | 0 |
| R31_flag | 0 |
| R32_flag | 1 |
| R33_flag | 1 |

Based on the equations in Tables 1 and 2, the processor 70 will determine that there is a fault in the primary lateral acceleration sensor 20 if the processor 70 receives the pattern of binary ones and zeros from the sub-system 14 as shown in Table 5. The residuals R13, R23 and R33 are not used as part of the lateral acceleration fault determination because the resulting estimates for these residuals are insensitive to faults in the lateral acceleration sensor 20. Similarly, constant values of the thresholds for the residuals are chosen.

TABLE 5

| | |
|---|---|
| R11_flag | 1 |
| R12_flag | 0 |
| R21_flag | 1 |
| R22_flag | 1 |
| R31_flag | 1 |
| R32_flag | 0 |

Based on the model equations in Table 1, the processor 70 will determine that there is a fault in the hand-wheel angle sensor 18, if the processor 70 receives the pattern of binary ones and zeros shown in Table 6 from the sub-system 12. The residuals R22, R23 and R31 are not used in this pattern because of numerical insensitivities to faults. R22 and R31 are not used because they are very sensitive to bank angle effects, well known to those skilled in the art.

TABLE 6

| | |
|---|---|
| R11_flag | 0 |
| R12_flag | 1 |
| R13_flag | 1 |
| R21_flag | 0 |
| R32_flag | 1 |
| R33_flag | 1 |

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining whether any one of a plurality of different types of sensors on a vehicle has failed, said method comprising:
   generating a plurality of estimates of an output of each of the plurality of different types of sensors based on a plurality of models;
   comparing the estimates to a measured output signal from the plurality of different types of sensors to generate a plurality of residuals;
   comparing the plurality of residuals to a threshold;
   providing a first value if the residual exceeds the threshold and a second value if the residual does not exceed the threshold; and
   determining that one or more of the sensors have failed if the pattern of the values is a predetermined pattern where the values in the pattern are values from the comparison of the residuals to the threshold for more than one different type of sensor.

2. The method according to claim 1 wherein the plurality of different types of sensors are selected from the group consisting of a hand-wheel angle sensor, a lateral acceleration sensor and a yaw rate sensor.

3. The method according to claim 1 wherein the threshold is an adaptive threshold that varies depending on measured values from certain vehicle sensors.

4. The method according to claim 3 wherein the certain vehicle sensors include a lateral acceleration sensor and a yaw rate sensor.

5. The method according to claim 1 wherein generating a plurality of estimates of an output of the plurality of different types of sensors based on a plurality of models includes generating a plurality of estimates of an output of the plurality of different types of sensors based on a plurality of models, where the models use measurements from a plurality of sensors.

6. The method according to claim 1 wherein generating a plurality of estimates of an output of the plurality of different types of sensors based on a plurality of models includes using three different models for each sensor type.

7. The method according to claim 1 wherein the plurality of different types of sensors is part of an integrated vehicle stability system.

8. The method according to claim 7 wherein the integrated vehicle stability system includes an active braking control sub-system, an active front-wheel steering assist sub-system and a semi-active suspension sub-system.

9. A method for determining whether one or more of a plurality of sensors in a vehicle have failed, said method comprising:
   providing a hand-wheel angle sensor for providing a road wheel angle signal;
   providing a lateral acceleration sensor for providing a lateral acceleration signal;
   providing a yaw rate sensor for providing a yaw rate signal;
   providing a vehicle speed sensor for providing a vehicle speed signal;
   generating a plurality of road wheel angle estimates of an output of the hand-wheel angle sensor based on a plurality of road wheel angle models, said road wheel angle models using the lateral acceleration signal, the yaw rate signal and the vehicle speed signal;
   generating a plurality of lateral acceleration estimates of an output of the lateral acceleration sensor based on a plurality of lateral acceleration models, said lateral acceleration models using the road wheel angle signal, the yaw rate signal and the vehicle speed signal;
   generating a plurality of yaw rate estimates of an output of the yaw rate sensor based on a plurality of yaw rate models, said yaw rate models using the lateral acceleration signal, the road wheel angle signal and the vehicle speed signal;
   comparing the road wheel angle estimates to the road wheel angle signal to generate a plurality of road wheel angle residuals;
   comparing the lateral acceleration estimates to the lateral acceleration signal to generate a plurality of lateral acceleration residuals;
   comparing the yaw rate estimates to the yaw rate signal to generate a plurality of yaw rate residuals;
   comparing the plurality of road wheel angle residuals to an adaptive threshold that changes for different vehicle operating conditions, said adaptive threshold being based on the lateral acceleration signal and a derivative of the yaw rate signal;
   comparing the plurality of lateral acceleration residuals to a lateral acceleration threshold;
   comparing the plurality of yaw rate residuals to a yaw rate threshold;
   providing a first value if the particular residual exceeds the particular threshold and a second value if the particular residual does not exceed the particular threshold;
   determining that the hand-wheel angle sensor has failed if the pattern of the first and second values is a predetermined pattern where the first and second values in the pattern are values from the comparison of the residuals and the threshold for at least two different sensor types;
   determining that the lateral acceleration sensor has failed if the pattern of the first and second values is a predetermined pattern where the first and second values in the pattern are values from the comparison of the residuals and the threshold for at least two different sensor types; and
   determining that the yaw rate sensor has failed if the pattern of the first and second values is a predetermined pattern where the first and second values in the pattern are values from the comparison of the residuals and the threshold for at least two different sensor types.

10. The method according to claim 9 wherein generating a plurality of estimates of an output of the hand-wheel angle sensor, the lateral acceleration sensor and the yaw rate sensor includes using three separate road wheel angle models, three separate lateral acceleration models and three separate yaw rate models.

11. The method according to claim 9 wherein the sensors are part of an integrated vehicle stability system.

12. The method according to claim 11 wherein the integrated vehicle stability system includes an active braking control sub-system, an active front-wheel steering assist sub-system and a semi-active suspension sub-system.

13. A system for monitoring a plurality of different types of sensors on a vehicle, said system comprising:
   a plurality of vehicle sensors of different types providing measured output signals of vehicle parameters;
   a model processor for generating a plurality of estimate signals of the output for each of the sensors based on a plurality of models, wherein the models use the measured output signals of vehicle parameters;

a first comparator responsive to a measured signal from the particular sensor and the estimate signals, said first comparator generating a plurality of residuals based on the difference between the measured signal and the estimate signals;

a threshold processor generating a threshold signal;

a second comparator responsive to the plurality of residuals and the threshold signal, said second comparator outputting a first value if the residual is greater than the threshold signal and a second value if the residual is less than the threshold signal; and a decision logic processor responsive to the plurality of first and second values, said decision logic processor determining that the particular sensor has failed if the pattern of values is a predetermined pattern where the values in the pattern are values from the comparison of the residuals and the threshold for more than one different type of sensor.

14. The system according to claim 13 wherein the plurality of sensors are selected from the group consisting of a hand-wheel angle sensor, a lateral acceleration sensor, a vehicle speed sensor and a yaw rate sensor.

15. The system according to claim 13 wherein the threshold processor is an adaptive threshold processor that provides an adaptive threshold that changes in response to the measured signals from at least two of the plurality of sensors.

16. The system according to claim 15 wherein the at least two sensors are a yaw rate sensor and a lateral acceleration sensor.

17. The system according to claim 13 wherein the model generator uses three separate models for each sensor.

18. The system according to claim 13 wherein the system is part of an integrated vehicle stability system.

19. The system according to claim 18 wherein the integrated vehicle stability system includes an active braking control sub-system, an active front-wheel steering assist sub-system and a semi-active suspension sub-system.

* * * * *